United States Patent [19]
Maeda et al.

[11] Patent Number: 4,676,864
[45] Date of Patent: Jun. 30, 1987

[54] BONDING METHOD OF SEMICONDUCTOR DEVICE

[75] Inventors: Yukio Maeda; Yoshifumi Kitayama; Shuichi Murakami, all of Hirakata, Japan

[73] Assignee: Matsushita Electric Industrial Co., Ltd., Kadoma, Japan

[21] Appl. No.: 863,152

[22] Filed: May 14, 1986

[30] Foreign Application Priority Data
May 15, 1985 [JP] Japan ............................. 60-103021

[51] Int. Cl.⁴ .................. B29C 37/00; B44C 1/22; C03C 15/00; C03C 25/06
[52] U.S. Cl. ............................ 156/633; 156/655; 156/668; 427/88
[58] Field of Search .............. 156/629, 633, 655, 657, 156/659.1, 662, 668, 230; 29/589–591; 357/69; 427/88

[56] References Cited
U.S. PATENT DOCUMENTS

| | | | |
|---|---|---|---|
| 3,751,292 | 8/1973 | Kongable | 156/656 X |
| 4,070,230 | 1/1978 | Stein | 156/662 X |
| 4,310,570 | 1/1982 | Calviello | 156/662 X |

*Primary Examiner*—William A. Powell
*Attorney, Agent, or Firm*—Cushman, Darby & Cushman

[57] ABSTRACT

A bonding method of semiconductor device by using a film carrier; A heat-resistive insulating layer is deposited all over the surface of a dummy wafer on which a photo-resist film having a predetermined pattern is previously formed; The photo-resist film is removed together with the heat-resistive insulating layer for forming openings; Bumps are formed on the openings by plating using the heat-resistive insulating layer as a mask; After transferring the bumps to inner leads, the bumps of the inner leads are bonded to bonding pads of the semiconductor element.

12 Claims, 12 Drawing Figures

BONDING METHOD OF SEMICONDUCTOR DEVICE

FIELD OF THE INVENTION AND RELATED ART STATEMENT

1. Field of the Invention

This invention relates to a bonding method of semiconductor device.

2. Description of the Related Art

There are two bonding methods of semiconductor device by using film carrier. One is method that tin plated inner leads of the film carrier are thermo-compression bonded with gold bumps previously formed on bonding pads of the semiconductor element. The other is a method that the gold bumps previously formed on the inner leads are thermo-compression bonded to the bonding pads of the semiconductor element.

The former necessitates difficult process for forming the gold bumps directly on the semiconductor element, and the former method is expensive. Therefore, it is not used in conventional I.C chip. The latter does not necessitate difficult process for forming the gold bumps directly on the semiconductor element, because the gold bumps are formed on the inner leads, and hence the latter costs cheap. Therefore, it is used in conventional I.C chip.

Referring to FIGS. 1 to 3, a prior method for forming the gold bumps is illustrated. A platinum film 103 is formed over a titanium film 102 formed on an insulating substrate 101. Further, as shown in FIG. 1, an organic photo resist 105 is applied over the platinum film 103.

Then as shown in FIG. 2, the organic photo resist 105 is patterned by using a photo mask, so as to make the dummy wafer having openings 107 for forming the bumps.

Then as shown in FIG. 3, the bumps 106 of gold are formed by plating by using the titanium film 102 and the platinum film 103 as the plating electrode. In the next place, the organic photo-resist is removed by using organic solvent so as to prevent softening or transformation of the organic photo-resist 105 and to prevent adhering of the organic photo-resist 105 to the gold bumps 106 or the tool for thermo-compression bonding. Such adhering has a bad influence upon a step for bonding the gold bumps to the bonding pads of the semiconductor element.

Then, the gold bumps 106 are transferred to the inner leads of the film carrier.

As shown in FIG. 4, in the prior method, the organic photo resist must be again applied, patterned and removed for again forming of the gold bumps 106. In FIG. 4, a first bonding indicates the bonding of the gold bumps 106 onto the inner leads of the film carrier. A second bonding indicates the bonding of the gold bumps 106 bonded on the inner leads onto the bonding pads of the semiconductor element.

As mentioned above, in the prior method the removing step must be necessary before the first bonding, because the organic photo-resist 105 is used as mask for plating. Further, it necessitates repetition of the above-mentioned steps after the application step of the organic photo resist 105. Therefore, the prior method was expensive in the material cost of the organic photo resist 105, in the wages and in manufacturing apparatuses.

OBJECT AND SUMMARY OF THE INVENTION

A principal object of this invention is to provide a bonding method of semiconductor device having no removing step of the photo-resist as a mask for plating, and to provide dummy wafer capable of repeated uses.

Bonding method of semiconductor device in accordance with the present invention comprises the steps of forming a photo-resist film having predetermined pattern on a conductive layer formed on a dummy wafer, depositing a heat-resisting insulating layer all over the surface of said dummy wafer, removing said photo-resist film together with said heat-resistive insulating layer deposited thereon, thereby forming openings, forming bumps on said openings by plating using said heat-resisting insulating layer as a mask and using said conductive layer as a plating electrode, transferring said bumps to inner leads from said dummy wafer, and thermo-compression bonding the said bumps of the inner leads to bonding pads of the semiconductor element.

DESCRIPTION OF THE PREFERRED EMBODIMENTS

In the present invention, a dummy wafer is a medium for forming the bumps 106 thereon by electrolytic plating. As the dummy wafer, that which has a good conductivity at least in their surface, has flat surface and has appropriate adhesion and exfoliation characteristics to the bumps, is suitable. For example, such dummy wafer can be mentioned that, which comprises a glass substrate having double conductive layer of a titanium film and a platinum film thereon, a glazed alumina substrate having a double-layered thin conductive layers of titanium film and a platinum film thereon, or polished metal plate whereon unnecessary parts are covered by an insulative coating.

Figure 1:
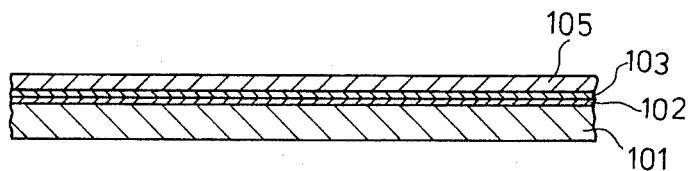
FIGS. 1 to 3 is a cross-sectional view for showing the prior bonding method of semiconductor device.
Figure 2:
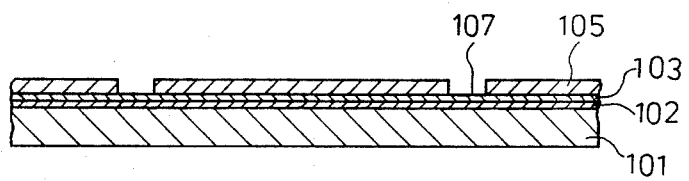
Figure 3:
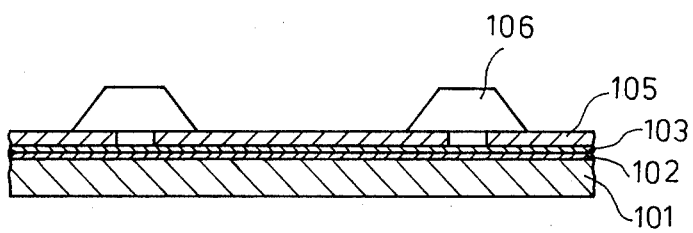
Figure 4:
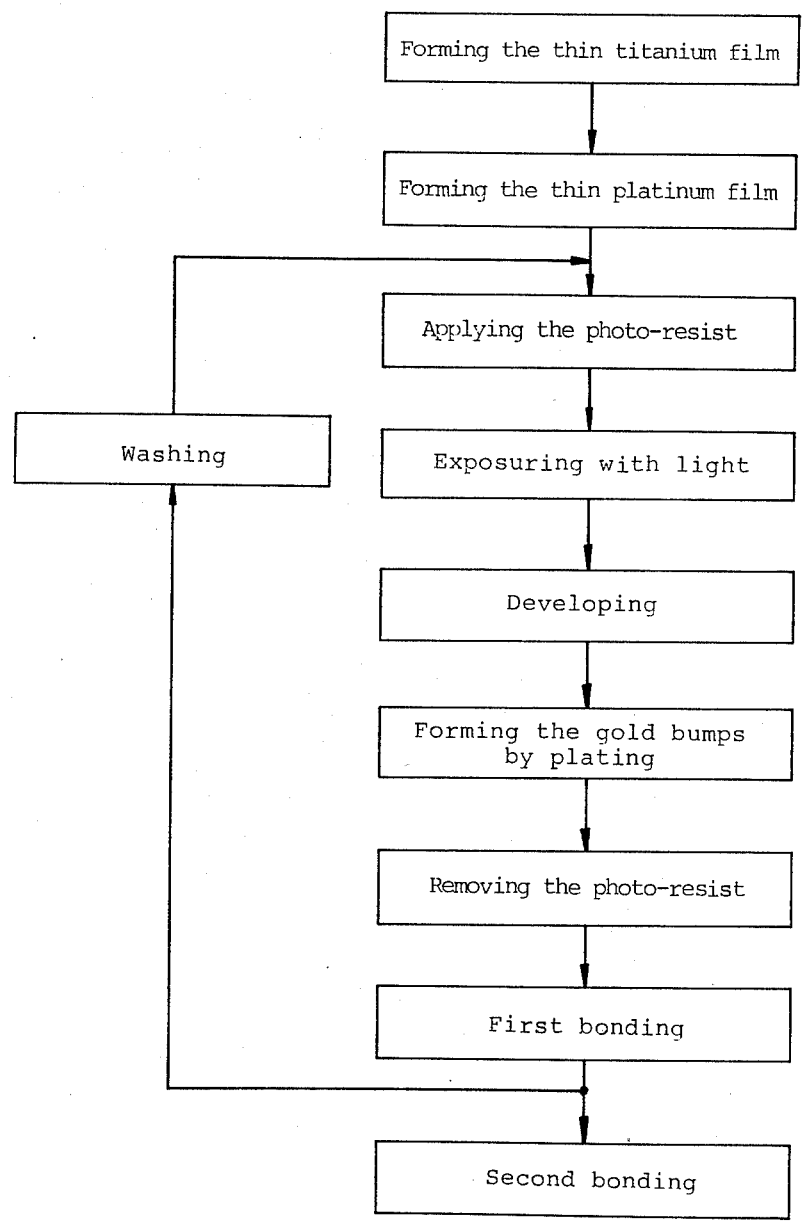
FIG. 4 is a flow chart of the prior bonding method of semiconductor device.
Figure 5:
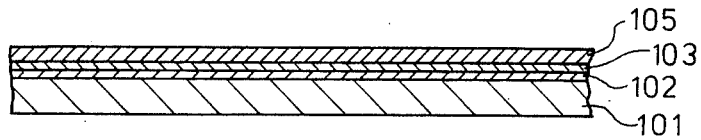
FIGS. 5 to 11 is a cross-sectional view for showing the bonding method of semiconductor device in accordance with the present invention.

A preferred embodiment is described referring to FIGS. 5 to 11. Referring to FIG. 5, a platinum film 103 is formed on a titanium film 102 formed on a insulating substrate 101, for example, a glass dummy substrate. The underlying titanium film 102 is formed for improving the adhesion of the platinum film 103. The organic photo resist 105 is applied on the platinum film 103.

Figure 6:
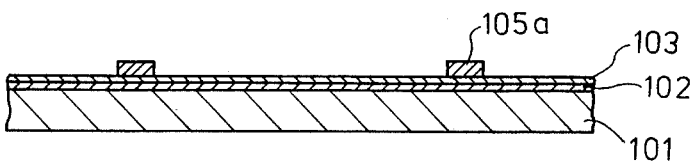

Then as shown in FIG. 6, after a pre-baking of the organic photo resist 105, light exposure is made by using a photo mask, so as to make the projections 105a for forming an openings 107. Then, a post-baking is carried out.

Figure 7:
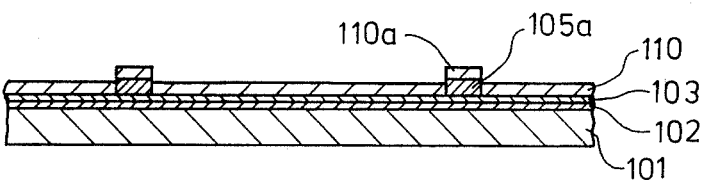
Figure 8:
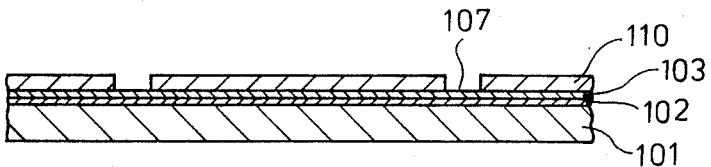

Next as shown in FIG. 7, a heat-resistive insulating layer 110 of $SiO_2$ is deposited all over the surface of the dummy wafer by sputtering method. From 5000 Å to 20000 Å thickness of the photo-resist pattern 4 is desirable. About 14000 Å thickness particularly desirable for the photo-resist. From 2000 Å to 10000 Å thickness of the SiO₂ film 5 is desirable. About 7000 Å thickness is particularly desirable for the SiO₂ film 5. Instead of the sputtering, vacuum evaporation can be used. By heating the dummy wafer at about 500° C., the organic photo-resist 105a are destroyed by fire, so the resistive insulating layers 110a on the organic photo resists 105 a are also removed. Therefore, as shown in FIG. 8, the dummy wafer having the heat-resistive insulating layer as a mask for plating is provided. The dummy wafer has the openings 107. Instead of the destroying by fire, solvent washing, alkaline treating or treating by can be used.

Then, the dummy wafer is steeped in cationic surfactant of 5% as solvent for 5 minutes and dried after washing in water. This solvent cleaning is carried out for improving the exfoliation of the bumps 106 from the dummy wafer.

Figure 9:
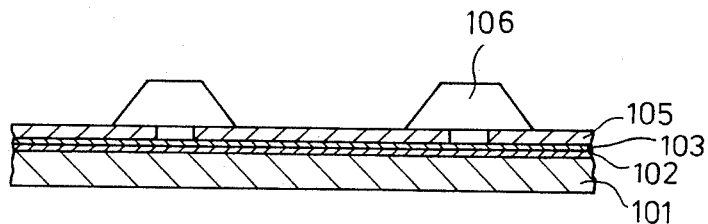
Figure 10:
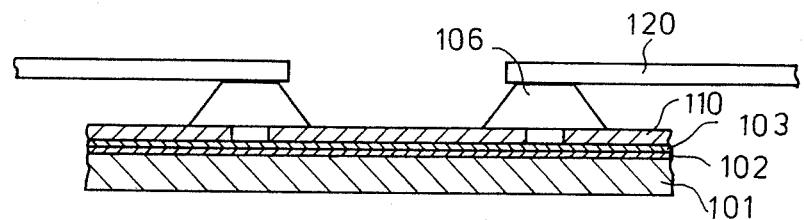

Next as shown in FIG. 9, the bumps 106 of gold are formed with 20 μm thickness by plating by using the titanium film 102 and the platinum film 103 as the plating electrode. Then as shown in FIG. 10, the gold bumps 106 are transferred to the tin plated inner leads 120 of the film carried by using a known thermo-compression bonding tool (not shown). This step is called first bonding step. In the first bonding step, suitable temperature for the lead 120 is such a temperature that at which eutectic mixture of gold of the bump 106 and the tin of the inner leads 120 is formed. For the transferring, thermo-compression bonding and/or ultrasonic bonding can be used.

Figure 11:
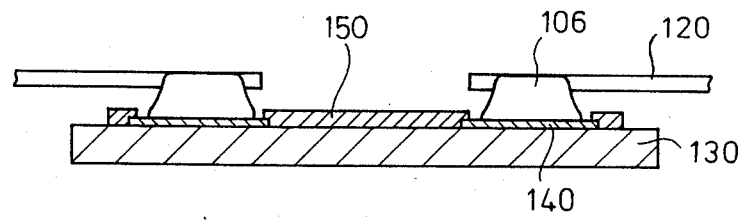
Figure 12:
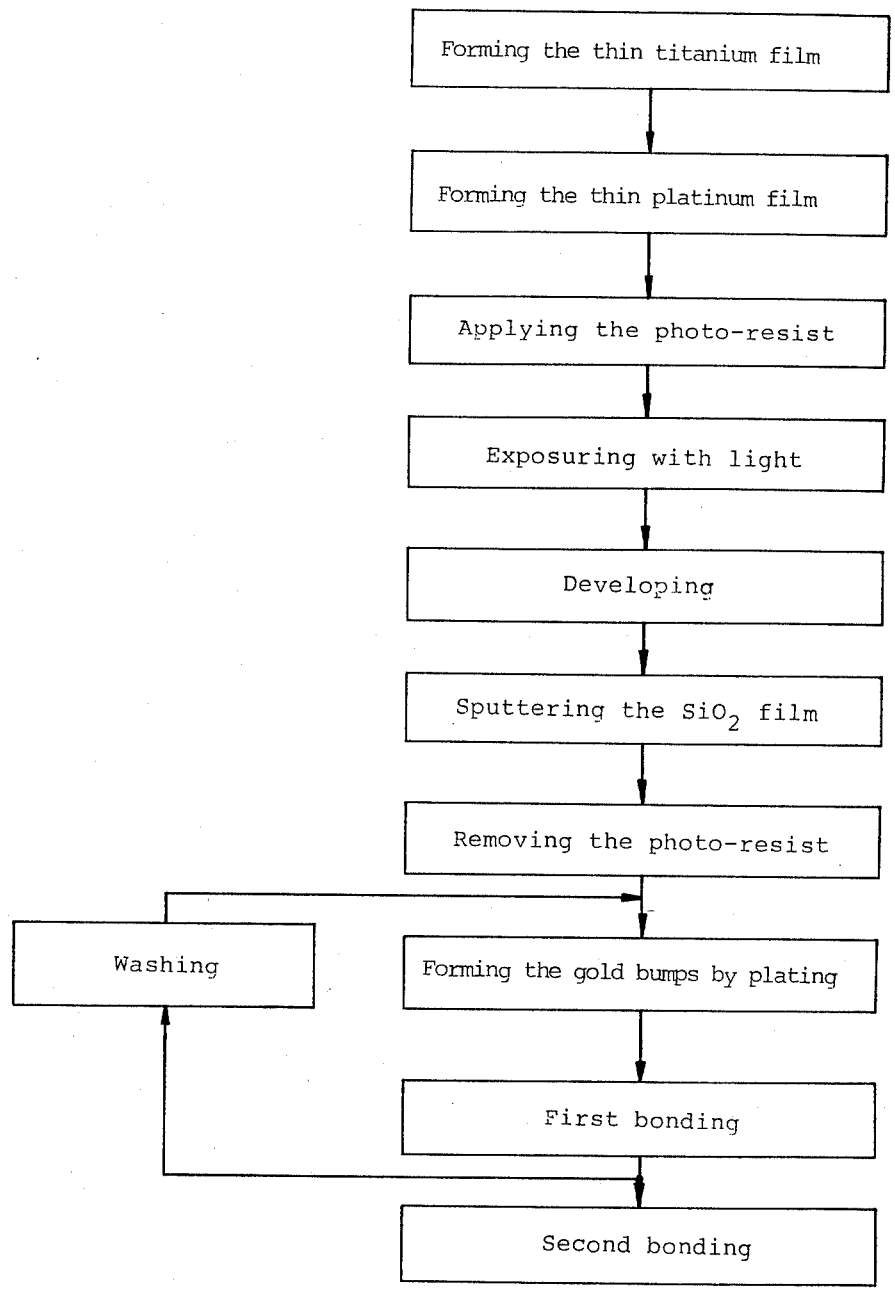
FIG. 12 is a flow chart of the bonding method of semiconductor device in accordance with the present invention.

Next as shown in FIG. 11, the bumps 106 of the inner leads 120 are bonded to bonding pads 140 of the semiconductor element 130 by using thermo-compression bonding tool (not shown). This step is called second bonding step. In the second bonding step, suitable temperature of the bumps 106 is such a temperature that at which the eutectic mixture of gold of the bump 106 and the gold of the bonding pad 140 is formed.

The same gold bumps 106 can be formed again by again plating gold after removing the remaining bumps by washing in water. According to the inventor's experimental research, the dummy wafer can be used for forming the bumps 106 without hindrance even after 20 times repeating of plating and first bonding.

One member of amines, amine-oxides, amides, quaternary ammonium salts or the like is suitable for the cationic surfactant. An aqueous solution of the cationic surfactant having the density of from several % to ten and several % is suitable. The treatment of the surface-active agent may be carried out before applying the photo resist 105.

As has been described above, the bonding method in accordance with the present invention does not necessitate the removing step of the mask for plating, because the heat-resistive insulating layer is used for the mask for plating. Therefore, the heat-resistive insulating layer can be repeatedly used. In the present invention, the etching step is not necessary because the heat-resistive insulating layer can be patterned by destroying the organic photo resist 105a by fire.

What we claimed is
1. Bonding method of semiconductor device comprising the steps of
    forming a photo-resist film having a predetermined pattern on a conductive layer formed on a dummy wafer,
    depositing a heat-resistive insulating layer all over the surface of said dummy wafer,
    removing said photo-resist film together with said heat-resistive insulating layer deposited thereon, thereby forming openings,
    forming bumps on said openings by plating using said heat-resistive insulating layer as a mask and using said conductive layer as a plating electrode,
    transferring said bumps to inner leads from said dummy wafer, and
    thermo-compression bonding the said bumps of the inner leads to bonding pads of the semiconductor element.
2. Bonding method of semiconductor device in accordance with claim 1, wherein
    said depositing of the heat-resistive insulating layer is carried out by vacuum evaporation method.
3. Bonding method of semiconductor device in accordance with claim 1, wherein
    said depositing of the heat-resistive insulating layer is carried out by sputtering method.
4. Bonding method of semiconductor device in accordance with claim 1, wherein
    said removing of the photo-resist film is carried out by solvent cleaning.
5. Bonding method of semiconductor device in accordance with claim 1, wherein
    said removing of photo-resist film is carried out by alkaline treating.
6. Bonding method of semiconductor device in accordance with claim 1, wherein
    said removing of photo-resist film is carried out by treating by nitric acid, fuming.
7. Bonding method of semiconductor device in accordance whith claim 1, wherein
    said removing of photo-resist film is carried out by treating by heating.
8. Bonding method of semiconductor device in accordance with claim 1, wherein
    said dummy wafer comprises a heat-resistive insulating substrate having a thin film of platinum thereon.
9. Bonding method of semiconductor device in accordance with claim 1, wherein
    said conductive layer consssits of a titanium film and a platinum film formed on said titanium film.
10. Bonding method of semiconductor device in accordance with claim 1, further comprises step of treating said conductive layer by surface active agent before forming the bumps.
11. Bonding method of semiconductor device in accordance with claim 10, wherein
    said surface active agent is cationic surfactant.
12. Bonding method of semiconductor device in accordance with claim 1, wherein
    said bumps consist of gold.

* * * * *